United States Patent [19]

Huseby et al.

[11] 4,086,311

[45] Apr. 25, 1978

[54] METHODS FOR INCREASING THE CRUSHABILITY CHARACTERISTICS OF CORES FOR CASTING ADVANCED SUPERALLOY MATERIALS

[75] Inventors: Irvin C. Huseby, Schenectady; Frederic J. Klug, Amsterdam, both of N.Y.

[73] Assignee: General Electric Company, Schenectady, N.Y.

[21] Appl. No.: 775,760

[22] Filed: Mar. 9, 1977

[51] Int. Cl.² ............................................. C04B 35/64
[52] U.S. Cl. ....................................... 264/43; 106/62; 106/73.2; 164/41; 164/132; 164/138; 264/56; 264/221; 264/317; 425/DIG. 12
[58] Field of Search .................... 106/62, 65, 73.2; 264/42, 43, 221, 56, 317; 164/41, 132, 138; 425/DIG. 12

[56] References Cited

U.S. PATENT DOCUMENTS

| | | | |
|---|---|---|---|
| 2,691,738 | 10/1954 | Matthias | 106/73.2 X |
| 3,311,488 | 3/1967 | Seufert | 164/41 X |
| 3,972,367 | 8/1976 | Gigliotti, Jr. | 164/138 X |
| 4,043,381 | 8/1977 | Mazdiyasni | 164/41 X |

*Primary Examiner*—Thomas P. Pavelko
*Attorney, Agent, or Firm*—Donald M. Winegar; Joseph T. Cohen; Jerome C. Squillaro

[57] ABSTRACT

The crushability of a ceramic article suitable for use in the casting and directional solidification of advanced superalloy materials is enhanced by utilizing a two-phase mixture of material and inducing microcracks in the material. The crushability is further enhanced by forming the article to include a predetermined porosity content.

10 Claims, No Drawings

METHODS FOR INCREASING THE CRUSHABILITY CHARACTERISTICS OF CORES FOR CASTING ADVANCED SUPERALLOY MATERIALS

BACKGROUND OF THE INVENTION

1. Field of the Invention

This invention relates to a method for increasing the crushability characteristics of a ceramic article suitable for use in the casting and directional solidification of advanced superalloy material.

2. Description of the Prior Art

Superalloys, such as NiTaC-13 and other similar metal eutectic alloys, are cast and directionally solidified at temperatures of about 1700° C and above for upwards of 30 hours exposure thereto. Therefore, cores and molds employed therewith must have high temperature strength and nonreactivity with the molten metal. That is, the mold and core material must not dissolve in the cast molten metal nor form an excessively thick interface compound with the molten metal. The cores also must be compatible with the superalloy to prevent hot tearing during solidification.

It is therefore an object of this invention to provide a new and improved method for enhancing the crushability characteristics of a ceramic article employed in the casting of advanced superalloy materials.

Another object of this invention is to subject a ceramic material to thermal shock to form microcracks in the microstructure of the material to improve the crushability characteristics of the article.

A further object of this invention is to provide a structure for a ceramic article which includes a predetermined porosity content, in addition to forming the microcracks in the material to improve the crushability characteristics of the article.

Other objects of this invention will, in part, be obvious and will, in part, appear hereinafter.

BRIEF DESCRIPTION OF THE INVENTION

In accordance with the teachings of this invention there is provided a method for increasing the crushability characteristics of a ceramic article suitable for use in the casting and directional solidification of advanced superalloy materials. The method includes selecting a two-phase mixture which is a material which is one selected from the group consisting of $La_2O_3 \cdot 11Al_2O_3 + La_2AlO_3$, $La_2O_3 \cdot 11Al_2O_3 + Al_2O_3$ and $MgAl_2O_4 + Al_2O_3$ and forming an article therefrom which has a predetermined configuration and a predetermined porosity content. The porosity content may range from about 10 volume percent to about 70 volume percent depending upon the material composition and the use of the article. Thereafter, the ceramic article is subjected to thermal shock to cause the formation of microcracks in the microstructure of the material. The microstructure of the material exhibits a two-phase microstructure. The microcracks are initiated at the interface of two phases and extend across or through one phase. Should it reach a second interface between that one phase and another one of the second phase, the propagation of the crack ceases or changes direction. Often the change in direction results in a crack developing along the interface between the two phases. A change in direction of the crack propagation requires the expenditure of additional energy and therefore helps to stop or at least minimize the total length that the crack propagates.

A method for causing the formation of microcracks is by heating the ceramic article to an elevated temperature and rapidly cooling the article therefrom in a suitable quench medium, such for example, as water.

DESCRIPTION OF THE INVENTION

Highly crushable cores suitable for use in casting and directional solidification of superalloy material comprise two-phase mixtures of $La_2O_3 \cdot 11Al_2O_3 + LaAlO_3$, $La_2O_3 \cdot 11Al_2O_3 + Al_2O_3$ and $MgAl_2O_4 + Al_2O_3$. Upon preparing the particular material for a core, it is pressed and sintered to a preferred density within a predetermined range of porosity for the desired end use. Each two-phase material has a coefficient of thermal expansion which is less than that of the of the superalloy alloy, such as NiTaC-13, which is cast about them. Consequently, upon cooling of the cast melt, the metal is subject to hot tearing.

However, the susceptability to hot tearing is reduced because during cooling of the two phase material mixture, microcracks may form in the core materials because of the differences in thermal expansion between the materials of the two phases. As a result the core material becomes more crushable. The cooling metal therefore shrinks upon the core and crushes the core thereby reducing the possibility of the occurrence of hot tearing in the metal castings.

The composition of the two-phase mixture $La_2O_3 \cdot 11Al_2O_3 + LaAlO_3$ may range from about 50 mole percent alumina to about 92 mole percent alumina, balance $La_2O_3$. The composition of the two phase mixture $La_2O_3 \cdot 11Al_2O_3 + Al_2O_3$ may range from about 0.1 mole percent $La_2O_3$ to about 8 mole percent $La_2O_3$, balance $Al_2O_3$. The composition of the two-phase mixture $MgAl_2O_4 + Al_2O_3$ may range from about 60 mole percent $Al_2O_3$ to about 99.9 mole percent $Al_2O_3$, balance MgO.

The materials are prepared in either one of two methods. The first method is to mechanically mix the proper amounts of each of the two oxides of the desired two-phase material mixture, press the material into the desired core configuration and porosity content and sinter the pressed core. The second method is to mechanically mix the proper amounts of each of the two oxides of the desired two-phase material mixture and subject the mixture to calcination. After calcining, the processed material is crushed and ground to a desired particle size. The prepared material is then pressed to the desired core configuration having a given density and sintered. A third method of preparing the material compositions is to mechanically mix the proper amounts of the oxides and then fuse-cast them by heating them close to or above their melting temperature. After fuse casting, the mixture will consist essentially of the desired mixed oxide compound. The fusedcast material is then refined into the desired particle size of from about 10 microns to about 150 microns by suitable milling techniques such as hammer-milling, ball-milling, and the like. The desired core configurations are then prepared from this material.

Complicated shapes may be prepared from materials made by any of the above methods by employing a suitable manufacturing technique such as injection molding, transfer molding, and the like.

The crushability of the core comprising one of the two-phase material mixtures may be enhanced by subjecting the core to thermal shock prior to its placing into a mold to be cast. The core is heated to a temperature of about 200° C to about 1000° C and quenched in a suitable agitated liquid, such as water maintained at 21° C or room temperature. The thermal shock treatment forms microcracks in the material as a result of the thermal stresses which develop at the interface between the two phases. The size of the cracks is limited by the presence of the two phases, that is the spinel composition surrounded by doped oxide material, which also limit the formation of cracks of sufficient size and length which could lead to catastrophic failure of the article of manufacture made from the ceramic material.

In all instances one must note that the amount of microcracks on the surface in contact with a cast metal must be limited so as to prevent excessive surface imperfections from occurring on the casting. In particular, molten metal must be prevented from entering and solidifying within the cracks so as to make removal of the ceramic material difficult. Additionally, the cost of surface finishing of the casting is increased.

The crushability of the ceramic article of manufacture, such as a core, is further enhanced by introducing a predetermined amount of porosity into the formed ceramic. It has been discovered that the porosity of the ceramic article may be as little as about 10 percent by volume of the article to as great as about 70 percent by volume of the article. It is desired that some of the porosity be continuous throughout so as to enhance the ability of the article to fracture and break up as the cast metal shrinks upon solidifying. A porosity content of about 10 percent by volume is necessary to assure some of the pores being interconnected. However, the degree or amount of porosity is also limited by the need of the article, or core, having a minimum integrity or strength to enable the core to be handled, placed in a mold and to withstand the initial shock and force of the melt being cast into the mold. The core must remain intact during initial solidification and yet be able to be crushed at a later time as the metal shrinks. However, the desired configuration of the cast shape is maintained throughout. In the instance of advanced superalloy materials such as NiTaC-13 directional solidification is practiced for upwards of 30 hours at temperatures in excess of about 1700° C.

Further the porous structure, in addition to the microcracks, enhances the removal of the ceramic material from the casting after solidifcation. This occurs in the material's inherent ability now to permit the entry of an etching or leaching solution to reach further into the interior regions of the core. At the same time a greater surface area of the ceramic material is available and exposed to the etching or leaching solutions thereby enabling the ceramic material removal to occur at a faster rate.

Suitable means for removing the ceramic material of two-phase mixtures of $La_2O_3 \cdot 11Al_2O_3 + LaAlO_3$, $La_2O_3 \cdot 11Al_2O_3 + Al_2O_3$ and $MgAl_2O_4 + Al_2O_3$ are molten salts such as molten fluoride salts and/or molten chloride salts. Such suitable salts are $M_3AlF_6$, $M_3AlF_6 + MF$, $M_3AlF_6 + M'F_2$ and $M_3AlF_6 + MCl$ wherein M is Li, Na or K and M' is Mg, Ca, Ba or Sr.

We claim as our invention:

1. A method for increasing the crushability characteristics of a ceramic article used as a core for casting metals including the process steps of:
   (a) selecting a two-phase mixture which is one selected from the group consisting of $La_2O_3 \cdot 11Al_2O_3 + LaAlO_3$, $La_2O_3 \cdot 11Al_2O_3 + Al_2O_3$ and $MgAl_2O_4 + Al_2O_3$;
   (b) forming an article to a predetermined configuration and a predetermined porosity content;
   (c) subjecting the formed article to thermal shock to induce microcracks therein wherein the material therein exhibits a two-phase microstructure in which microcracks are initiated at a first interface of two different phases, extending across at least part of one of the phases toward a second interface.

2. The method of claim 1 wherein the two phase mixture is $La_2O_3 \cdot 11Al_2O_3 + LaAlO_3$ and the mole percent of $Al_2O_3$ present therein is from about 50 to about 92.

3. The method of claim 1 wherein the two phase mixture is $La_2O_3 \cdot 11Al_2O_3 + Al_2O_3$ and the mole percent of $La_2O_3$ present therein is from about 0.1 to about 8.0.

4. The method of claim 1 wherein the two phase mixture is $MgAl_2O_4 + Al_2O_3$ and the mole percent of $Al_2O_3$ present therein is from about 60 to about 99.9.

5. The method of claim 1 wherein the porosity content is from about 10 percent by volume to about 70 percent by volume and at least some of the pores are interconnected.

6. The method of claim 5 wherein the porosity content is preferably from about 30 percent by volume to about 70 percent by volume.

7. The method of claim 1 wherein subjecting the formed article to thermal shock includes the process steps of
heating the article to an elevated temperature for a predetermined period of time to uniformly heat the article throughout, and
rapidly cooling the article from the elevated temperature to a lower temperature to form microcracks in the material and desired microstructure of the material.

8. The method of claim 7 wherein the two phase mixture is $La_2O_3 \cdot 11Al_2O_3 + LaAlO_3$ and the mole percent of $Al_2O_3$ present therein is from about 50 to about 92.

9. The method of claim 7 wherein the two phase mixture is $La_2O_3 \cdot 11Al_2O_3 + Al_2O_3$ and the mole percent of $La_2O_3$ present therein is from about 0.1 to about 8.0.

10. The method of claim 7 wherein the two phase mixture is $MgAl_2O_4 + Al_2O_3$ and the mole percent of $Al_2O_3$ present therein is from about 60 to about 99.9.

* * * * *